United States Patent [19]

Buschmann et al.

[11] Patent Number: 5,095,406
[45] Date of Patent: Mar. 10, 1992

[54] CIRCUIT BOARD ARRANGEMENT FOR ELECTRONIC/ELECTROMECHANICAL APPARATUS

[75] Inventors: Ulrich Buschmann, Elchingen; Günter Gomoll, Nersingen; Wolfgang Hauslaib, Langenau, all of Fed. Rep. of Germany

[73] Assignee: Mannesmann Aktiengesellschaft, Dusseldorf, Fed. Rep. of Germany

[21] Appl. No.: 587,013

[22] Filed: Sep. 24, 1990

[30] Foreign Application Priority Data

Sep. 27, 1989 [DE] Fed. Rep. of Germany ... 8911685[U]

[51] Int. Cl.⁵ .......................... H01R 9/09; H05K 1/00
[52] U.S. Cl. ..................... 361/408; 361/403; 361/406; 361/413; 439/78; 439/82
[58] Field of Search .............. 361/400, 403, 406, 413, 361/408, 409; 174/254, 261; 439/65, 66, 78, 82, 83, 84, 80, 876

[56] References Cited

U.S. PATENT DOCUMENTS 2,922,978  1/1960  Engel ................................. 439/82

Primary Examiner—Leo P. Picard
Assistant Examiner—Paramita Ghosh
Attorney, Agent, or Firm—Cohen, Pontani & Lieberman

[57] ABSTRACT

A circuit board arrangement that is for an electronic-/electromechanical apparatus and that has a mechanically actuable switch for at least two different power line voltages includes a circuit board having a polygonal cutout therethrough, which defines a plurality of polygon sides. A plurality of contact surfaces on a first side of the circuit board is provided, each such contact surface being associated with a respective polygon side of the polygonal cutout. Each of the contact surfaces is connected to an electrical conductor of a power supply unit and is positioned such that a pair of contact surfaces opposite to each other with respect to the cutout correspond to one voltage. A contact spring extends into the cutout and has a pair of spring legs respectively contacting a pair of contact surfaces positioned opposite to each other with respect to the cutout.

4 Claims, 1 Drawing Sheet 5,095,406

CIRCUIT BOARD ARRANGEMENT FOR ELECTRONIC/ELECTROMECHANICAL APPARATUS

BACKGROUND AND SUMMARY OF THE INVENTION

The present invention relates to a circuit board arrangement for electronic/electromechanical devices having a mechanically actuable switch for at least two different line voltages of an apparatus power supply unit.

For switching from an apparatus voltage present in one country to a different voltage (e.g. from 220 V to 110 V), so-called voltage-selection switches are customary. Such switches, however, are relatively expensive and arranged in a housing and are therefore expensive to manufacture.

An object of the present invention is to simplify voltage-selection switches of the expensive, conventional type and to assure their economical manufacture.

The foregoing object is achieved in accordance with the invention in the manner that a polygonal cutout is provided in a circuit board, the edge of which forms straight polygon sides. Each polygon side has a contact surface associated with it, each of which surfaces is connected to an electrical conductor of the apparatus power supply unit, with two opposite contact surfaces corresponding to one voltage potential, and that there can be introduced into the cutout a contact spring which has spring legs associated with the contact surfaces to contact them. This solution is extremely simple and economical and avoids the disadvantages of a closed voltage-selection switch housing. Thus a contact spring can be produced at a very low cost. Furthermore, more than two voltage steps can be covered in accordance with this principle.

One embodiment of the invention involves the spring legs extending through the cutout, and on one side contacting the contact surfaces and on the other side forming a U-shape. This development of the contact springs assures dependable retention in the circuit board.

Another improvement of the invention relates to locking, or securing, the contact springs onto the circuit board. For this purpose, a respective splay arm is formed in each of the spring legs of the contact springs. The splay arms may be formed by making cuts in the spring legs so that the resulting splay arms rest against the side of the circuit board opposite the contact surfaces in the installed condition of the contact springs.

BRIEF DESCRIPTION OF THE DRAWING

One embodiment of the invention is shown diagrammatically in the drawing and will be explained further below. In the drawing.

DETAILED DESCRIPTION OF THE PREFERRED EMBODIMENTS

Figure 1:
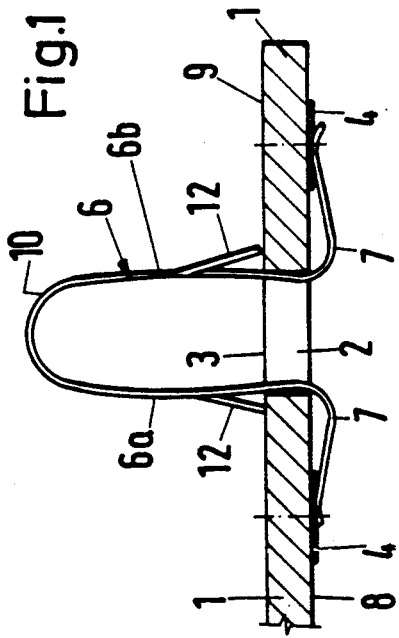
FIG. 1 is a cross section through a circuit board showing a side view of the contact springs.
Figure 2:
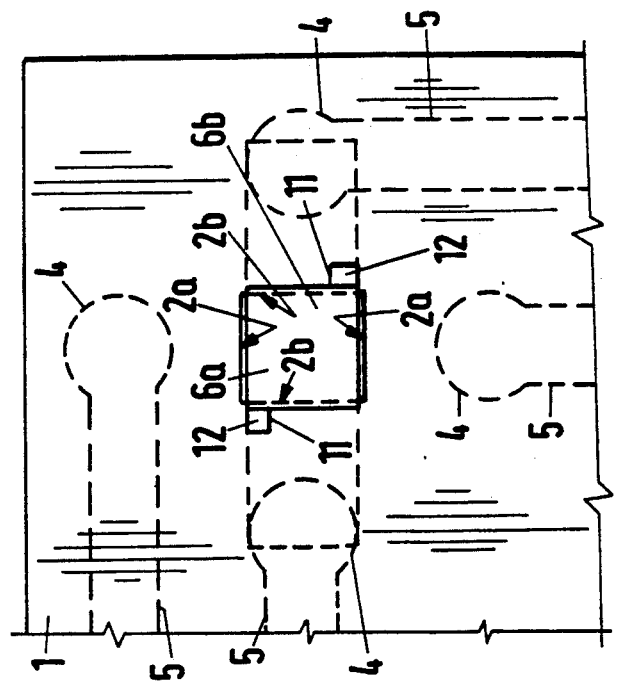
FIG. 2 is a top view of the circuit board with contact springs inserted, but which does not show in detail discrete or integrated parts on the board.
Figure 3:
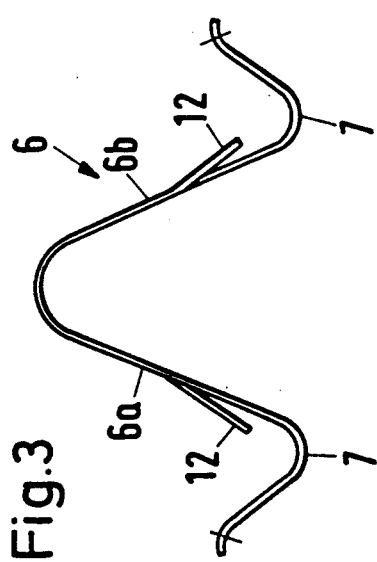
FIG. 3 is a side view of the contact springs before insertion through the cutout.

Referring to FIGS. 1-3, the circuit board 1 has a polygonal cutout 2. In the embodiment shown, the polygon is square. Accordingly, in each case two opposite pairs of polygon sides 2a and 2b are present, which form the edge 3 of the polygon. Each of the polygon sides 2a, 2b has a contact surface 4 with associated with it. An electric conductor 5 for an energy supply unit of the apparatus extends to each contact surface 4.

Two opposite contact surfaces 4 belong to a circuit of a single voltage potential of, for instance, 110 V or 220 V. The connecting of the two poles is caused by a contact spring 6. The contact spring 6, due to its property as a metallic conductor, connects the two opposite contact surfaces 4, the contact surface 4 having contacting spring legs 6a, 6b. In the embodiment shown in the drawing, the current therefore flows from the left-hand contact surface in FIG. 2 via the contact spring 6 to the right-hand contact surface 4 in FIG. 2 and furthermore into the line 5.

The dependable seat of the contact spring 6 is achieved not only by the shape of the legs but, in particular, by the course with respect to the cutout 2. The spring legs 6a, 6b extend through the cutout 2 of the circuit board 1 which consists of plastic, as shown, to the lower side of the circuit board 1. The spring legs 6a, 6b in this case, via a further bend 7, transmits a spring force to the contact surfaces 4. While, as shown, the spring legs 6a, 6b terminate on the contact surfaces 4 of the one side 8 of the circuit board, on the other side 9 the spring legs 6a, 6b are combined to form a U-shape 10.

The seat of the contact spring 6 is, however, still further improved. On the spring legs 6a, 6b there are arranged in each case incisions 11 facing in opposite directions. In this way, splay arms 12 can be bent out and rest in a clawlike manner, in the installed condition of the contact spring 6, on the side 9 of the circuit board opposite the contact surfaces 4. In this way there is obtained a mutual clamping of the splay arms 12 and the spring legs 6a, 6b via the bend 7.

It should be understood that the preferred embodiments and examples described are for illustrative purposes only and are not to be construed as limiting the scope of the present invention which is properly delineated only in the appended claims.

We claim:

1. A switch for selectively completing at least two circuits for conducting power to an electrical apparatus, comprising:
   a circuit board having a facial surface and a polygonal cutout defining straight polygon sides;
   at least two parts of contacts on said facial surface associated with at least two pairs of said polygon sides, which, when the contacts of a pair are electrically connected complete one of said circuits; and
   a conductive spring, insertable into said cutout in a first position or a second position, said spring comprising a pair of legs for selectively contacting a pair of contacts, so that when said spring is in said first position, said pair of legs completes one of said circuits, and when said spring is in said second position, said pair of legs completes another circuit.

2. The switch according to claim 1 wherein said conductive spring is inserted into said cutout to form a U-shape, and said pair of legs extends from said cutout and contacts a pair of contacts.

3. The switch according to claim 1, wherein said polygonal cutout defines a rectangle.

4. The switch according to claim 1, wherein said circuit board has a side opposite said facial surface, and each of said pair of legs comprises a splay arm for pressing against said opposite side of said circuit board, so as to secure said conductive spring when inserted into said circuit board.

* * * * *